United States Patent [19]
Sanwo et al.

[11] Patent Number: 5,633,602
[45] Date of Patent: May 27, 1997

[54] LOW VOLTAGE CMOS TO LOW VOLTAGE PECL CONVERTER

[75] Inventors: Ikuo J. Sanwo, San Marcos; Joseph D. Russell, La Mesa; Juei-Po Lin, La Jolla, all of Calif.

[73] Assignee: NCR Corporation, Dayton, Ohio

[21] Appl. No.: 528,445

[22] Filed: Sep. 14, 1995

[51] Int. Cl.[6] ............................................. H03K 19/0185
[52] U.S. Cl. ............................................. 326/73; 326/71
[58] Field of Search ............................. 326/70, 71, 73

[56] References Cited

U.S. PATENT DOCUMENTS 4,704,549  11/1987  Sanwo ............................. 326/73
4,890,019  12/1989  Hoyte ............................. 326/73
5,047,671   9/1991  Suthar ............................ 326/73
5,365,127  11/1994  Manley ........................... 326/73

*Primary Examiner*—Edward P. Westin
*Assistant Examiner*—Benjamin D. Driscoll
*Attorney, Agent, or Firm*—Merchant, Gould, Smith, Edell, Welter & Schmidt

[57] ABSTRACT

A means of converting low voltage CMOS logic levels operating with a 3.3 volts logic level to low voltage PECL logic levels operating with a 3.3 volts supply voltage and a 0.8 volts logic level. The circuit design is process insensitive, and the characteristics of the converter emulate the emitter follower outputs of ECL devices. The converter solves the signal ringing problems caused by open output conditions, and is less susceptible to electromagnetic interference.

12 Claims, 1 Drawing Sheet

LOW VOLTAGE CMOS TO LOW VOLTAGE PECL CONVERTER

BACKGROUND OF THE INVENTION

1. Field of the Invention

This invention relates in general to circuitry for converting signals, and more specifically, to circuitry for translating low voltage CMOS (LVCMOS) logic level signals to corresponding low voltage PECL (LVPECL) logic level signals to permit the coupling of CMOS circuits to ECL circuits.

2. Description of Related Art

Emitter Coupled Logic (ECL) is a highly specialized logic family normally used in high speed data transition applications and for high speed data transmission. Complementary Metal Oxide Semiconductor (CMOS) logic is normally used for low power applications. There are many applications where CMOS and ECL could be used in conjunction, such as spacecraft telemetry and communications, test equipment interfaces, and electronic devices, where one part of the circuitry has low power dissipation as a design criteria, and the other part of the circuitry has high speed as a design criteria.

However, CMOS and ECL devices use different logic levels, making interfacing the two logic families difficult. A simple translation from CMOS to ECL logic levels is further complicated by propagation delay in the converter and lower signal fidelity in the CMOS circuitry. In order to couple a CMOS circuit to an ECL circuit, the output voltage from the CMOS circuit must be translated by some form of translation circuit to match the input voltages required by the ECL circuit, and the circuitry for performing such translation should minimize propagation delay and maintain good signal fidelity at high speed operation.

It can be seen, then, that there is a need for a conversion technique for CMOS to ECL logic levels.

It can also be seen, then, that there is a need for a conversion technique that has a high switching speed and eliminates noise problems between the CMOS and ECL logic levels.

SUMMARY OF THE INVENTION

To overcome the limitations in the prior art described above, and to overcome other limitations that will become apparent upon reading and understanding the present specification, the present invention discloses a powerful and highly productive system and method for converting low voltage CMOS logic level signals to low voltage ECL level signals.

The present invention solves the above-described problems by providing a P-channel Metal Oxide Semiconductor (PMOS) source follower design which has compensation for variations in processing and manufacturing. The present invention also eliminates noise on the output signal by providing two PMOS source followers to translate the CMOS logic levels into ECL logic levels.

A system in accordance with the principles of the present invention comprises a constant current source to provide the current which sustains an ECL low logic level, a switchable current source for raising the current to sustain the ECL high logic level, a voltage divider to compensate for process variations in the constant current source, and a biasing means to provide the proper voltage offset and generate the proper output voltages for the ECL logic family.

One object of the present invention is to convert CMOS logic levels into ECL logic levels. Another object of the present invention is to reduce the output signal noise generated by level converters.

These and various other advantages and features of novelty which characterize the invention are pointed out with particularity in the claims annexed hereto and form a part hereof. However, for a better understanding of the invention, its advantages, and the objects obtained by its use, reference should be made to the drawing which forms a further part hereof, and to accompanying descriptive matter, in which there is illustrated and described specific examples of an apparatus in accordance with the invention.

DETAILED DESCRIPTION OF THE INVENTION

Figure 1:
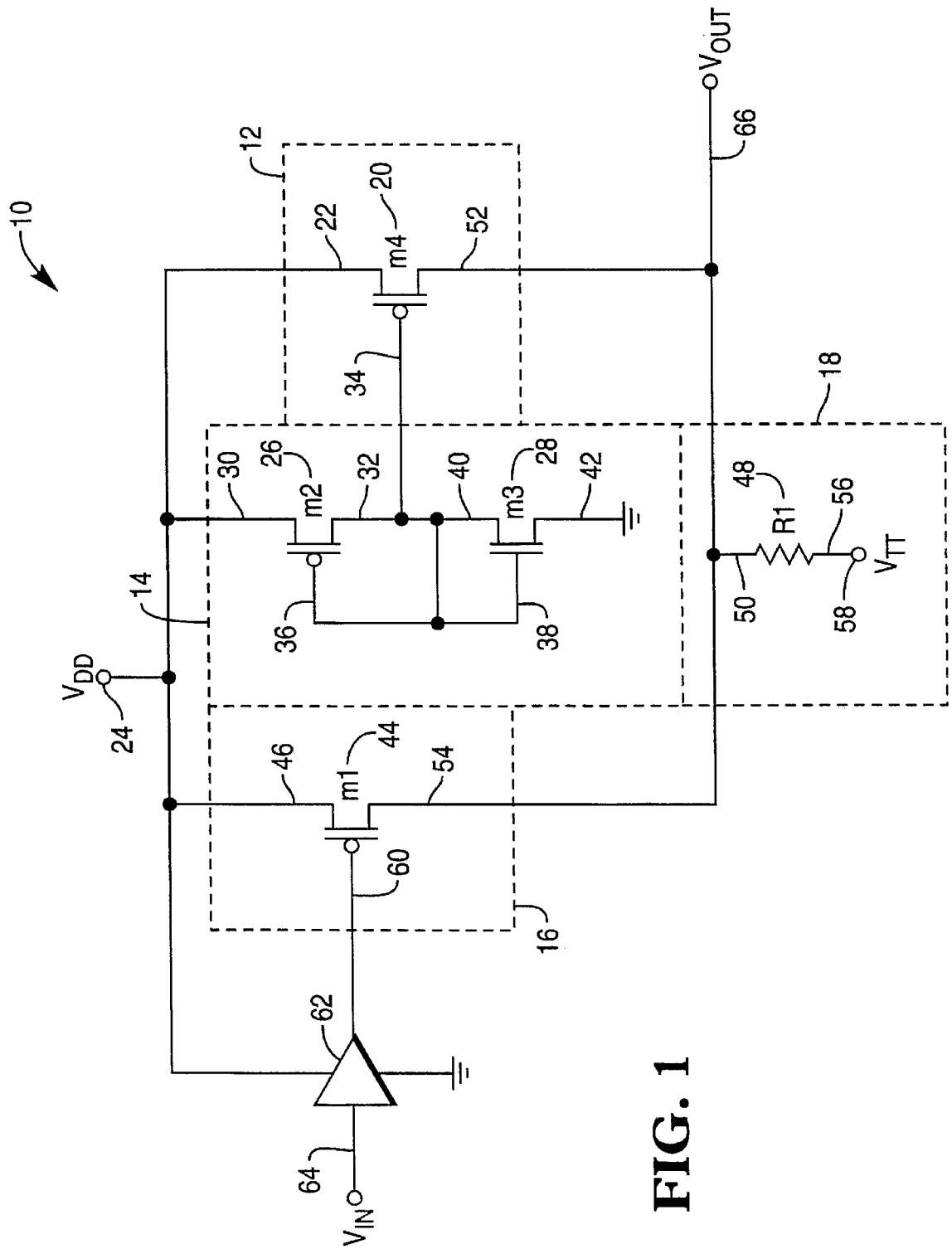
FIG. 1 is a schematic diagram of the low voltage CMOS to low voltage PECL converter.

In the following description of the preferred embodiment, reference is made to the accompanying drawing which forms a part hereof, and in which is shown by way of illustration the specific embodiment in which the invention may be practiced. It is to be understood that other embodiments may be utilized as structural changes may be made without departing from the scope of the present invention.

The present invention provides an apparatus and method for converting CMOS logic levels to ECL logic levels while maintaining high signal fidelity while reducing electromagnetic interference susceptibility.

FIG. 1 illustrates an low voltage CMOS to low voltage ECL converter 10 according to the present invention. The low voltage CMOS to low voltage ECL converter 10 is comprised of a constant current source 12, a voltage divider 14, a switchable current source 16, and a biasing circuit 18.

The constant current source 12 consists of PMOS transistor m4 20. The drain 22 of PMOS transistor m4 20 is connected to the supply voltage Vdd 24. In the low voltage CMOS logic family supply voltage Vdd 24 is set at 3.3 volts. However, one skilled in the art will recognize that a power supply of a different voltage could be used in accordance with the present invention. One skilled in the art will also recognize that an N-channel Metal Oxide Semiconductor (NMOS) device could be used in accordance with the present invention instead of PMOS transistor 20.

The voltage divider 14 consists of PMOS transistor m2 26 and NMOS transistor m3 28. The drain 30 of PMOS transistor m2 26 is connected to the supply voltage Vdd The source 32 of PMOS transistor m2 26 is connected to four different nodes of the circuit: the gate 34 of PMOS transistor m4 20, the gate 36 of PMOS transistor m2 26, and the gate 38 and the drain 40 of NMOS transistor m3 28. The source 42 of NMOS transistor m3 28 is connected to ground.

The switchable current source 16 consists of PMOS transistor m1 44. The drain 46 of PMOS transistor m1 44 is connected to the supply voltage Vdd The biasing circuit 18 consists of resistor R1 48. One terminal 50 of resistor R1 48 is connected to both the source 52 of PMOS transistor m4 20 and the source 54 of PMOS transistor m1 44. The other terminal 56 of resistor R1 is connected to bias voltage Vtt 58. Vtt is defined in FIG. 1 as 1.3 volts, but one skilled in the art will recognize that Vtt can be defined as any voltage. One skilled in the art will also recognize that the biasing circuit 18 could consist of devices other than resistor R1 48 and still be in accordance with the present invention.

The gate 60 of PMOS transistor m1 44 is connected to the output of amplifier 62. One skilled in the art will recognize that the gate 60 of PMOS transistor m1 44 could be connected directly to the input voltage 64 without deviating from the teachings of the present invention. The output of the low voltage CMOS to low voltage ECL converter 10 is the output voltage 66.

The converter operates by translating a LVCMOS logic level signal to a corresponding LVPECL level signal by using PMOS transistor m1 44 as a source follower, PMOS transistor m4 20 as a pull-up transistor, and voltage divider 14 as a process compensated reference voltage generation network.

The voltage divider 14, consisting of PMOS transistor m2 26 and NMOS transistor m3 28, is a conventional CMOS inverter with its output connected to its input. Standard MOS equations describe the operation of the voltage divider 14. The relationship is:

$$V_{out} = (Vdd + Vtp + Vtn \sqrt{Bn/Bp})/(1 + \sqrt{Bn/Bp})$$

since:

$$B = (\mu e/T_{ox})(W/L),$$
$$Bn/Bp = (Wn \times \mu n)/(Wp \times \mu p),$$
$$= 2 \times Wn/Wp,$$

thus:

$$V_{out} = (Vdd + Vtp + Vtn \sqrt{2 \times Wn/Wp})/(1 + \sqrt{2 \times Wn/Wp})$$

where:

Vdd is the supply voltage (3.3 volts),

Vtp is the threshold voltage of the P-channel devices,

Vtn is the threshold voltage of the N-channel devices,

Bn is the N-channel transistor gain factor,

Bp is the P-channel transistor gain factor,

W is the channel width of the device,

Wn is the channel width of the N-channel devices,

Wp is the channel width of the P-channel devices,

μn is the electron mobility in N-channel devices, and

μp is the electron mobility in P-channel devices.

Substituting:

Vdd=3.3 v,

Vtp=−0.6 v,

Vtn=0.6 v,

Wn=8 microns, and

Wp=16 microns, thereby gives a value of Vout=1.65 v, which is the desired value to control the PMOS transistor m4 20 current at 6 ma.

The operation of the LVCMOS to LVPECL converter is as follows. When the output of the amplifier 62 is at a CMOS high logic level (3.3 v), PMOS transistor m1 44 is off. PMOS transistor m4 20 is designed to deliver a constant current of 6 milliamps (ma). The current generated by PMOS transistor m4 20 flows through resistor R1 48, designed to be a 50 ohm termination resistor, and terminates at bias voltage Vtt 58, which is designed to be 1.3 volts. One skilled in the art will recognize that different current levels and different offset voltage Vtt levels will result in similar output voltages without deviating from the present invention. The output voltage 66 of the converter 10 is established by the value of Vtt plus the voltage drop across resistor R1 48:

$$=1.3 \text{ volts}+6 \text{ ma}\times 50 \text{ ohms}=1.3+0.3=1.6 \text{ volts},$$

wherein 1.6 volts is a standard logic level for ECL circuitry.

When output of the amplifier 62 is a CMOS logic low level (0 volts), PMOS transistor m1 44 is on. PMOS transistor m1 44 is designed to deliver 16 ma of current in an "on" condition. Therefore, a total current flow through resistor R1 56 will be 22 ma. The output voltage 66 of the converter 10 will again be given by:

$$=1.3 \text{ volts}+(16 \text{ ma}+6 \text{ ma})\times 50,$$

$$=1.3+22 \text{ ma}\times 50=1.3+1.1=2.4 \text{ volts},$$

wherein 2.4 volts is a standard logic level for ECL circuitry, and the voltage swing of 0.8 volts is the standard ECL logic transition state.

Another advantage to this design is that the characteristics of this network emulate those of the emitter follower output of ECL devices in terms of resistance, since the resistor R1 48 is sized at 50 ohms. Furthermore, this invention will improve signal ringing problems caused by the output open conditions, because the PMOS transistor m4 20 is always "on" and providing a current. The constant current lowers the ringing on the output usually associated with electronic devices during turn on. This reduced noise in turn decreases the EMI susceptibility and increases the noise margins for the converter 10. It also emulates the emitter follower output design of ECL devices.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A CMOS to ECL converter, comprising:

a constant current source for providing an initial current to sustain an ECL low logic level;

a voltage divider, coupled to the constant current source, for stabilizing the initial current provided from the constant current source, wherein the voltage divider is comprised of a complementary pair of MOS transistors;

a switchable constant current source, coupled to the constant current source, for providing an additional current to the initial current from the constant current source to sustain an ECL high logic level; and biasing means, coupled to the constant current source and the switchable constant current source, for providing a voltage offset to the initial current from the constant current source and the additional current from the switchable current source.

2. The CMOS to ECL converter of claim 1, wherein the constant current source comprises at least one PMOS transistor.

3. The CMOS to ECL converter of claim 1, wherein the constant current source comprises at least one NMOS transistor.

4. The CMOS to ECL converter of claim 1, wherein the biasing means comprises at least one MOS transistor.

5. The CMOS to ECL converter of claim 1, wherein the biasing means comprises at least one resistor.

6. The CMOS to ECL converter of claim 1, wherein the switchable constant current source comprises at least one MOS transistor.

7. A method for converting electrical signals, comprising the steps of:

compensating for temperature and process changes in a first current supply using a complementary pair of MOS transistors;

supplying a first current from the first current supply to a biasing circuit;

switching a second current supply in and out of the biasing circuit to provide a second current that supplements the first current; and providing a termination in the biasing circuit to change an output voltage depending on the amount of the first and second currents flowing into the biasing circuit.

8. The method of claim 7, wherein the providing step comprises providing a termination using at least one resistor.

9. The method of claim 7, wherein the providing step comprises providing a termination using at least one transistor.

10. The method of claim 7, wherein the supplying step comprises the step of supplying the first current using at least one PMOS transistor.

11. The method of claim 7, wherein the supplying step comprises the step of supplying the first current using at least one NMOS transistor.

12. The method of claim 7, wherein the switching step comprises switching a second current supply using at least one MOS transistor.

* * * * *